United States Patent
Chong et al.

(10) Patent No.: US 10,162,373 B1
(45) Date of Patent: Dec. 25, 2018

(54) VARIATION IMMUNE ON-DIE VOLTAGE DROOP DETECTOR

(71) Applicant: Ampere Computing LLC, Santa Clara, CA (US)

(72) Inventors: Yan Chong, San Jose, CA (US); Luca Ravezzi, San Francisco, CA (US); Alfred Yeung, Fremont, CA (US); Hamid Partovi, Menlo Park, CA (US)

(73) Assignee: Ampere Computing LLC, Santa Clara, CA (US)

( * ) Notice: Subject to any disclaimer, the term of this patent is extended or adjusted under 35 U.S.C. 154(b) by 0 days.

(21) Appl. No.: 15/444,478

(22) Filed: Feb. 28, 2017

(51) Int. Cl.
G05F 1/56 (2006.01)
G01R 19/00 (2006.01)
H03L 7/00 (2006.01)
H03K 5/24 (2006.01)
G01R 19/165 (2006.01)

(52) U.S. Cl.
CPC ......... G05F 1/56 (2013.01); G01R 19/16552 (2013.01); H03K 5/24 (2013.01); H03L 7/00 (2013.01)

(58) Field of Classification Search
CPC ....... G05F 1/56; G01R 19/16552; H03L 7/00; H03K 5/24
See application file for complete search history.

(56) References Cited

U.S. PATENT DOCUMENTS

| | | | | |
|---|---|---|---|---|
| 3,675,115 A | * | 7/1972 | O'Loughlin | H02M 3/04 323/282 |
| 4,591,962 A | * | 5/1986 | Schwarz | H05G 1/32 363/15 |
| 5,406,468 A | * | 4/1995 | Booth | H02M 3/28 363/15 |
| 5,894,423 A | * | 4/1999 | Ling | H03K 5/088 326/80 |
| 5,945,817 A | * | 8/1999 | Nguyen | G06F 1/305 323/273 |
| 6,586,971 B1 | | 7/2003 | Naffziger et al. | |
| 6,882,238 B2 | | 4/2005 | Kurd et al. | |
| 6,922,111 B2 | | 7/2005 | Kurd et al. | |
| 7,133,751 B2 | | 11/2006 | Kurd et al. | |
| 7,227,390 B1 | * | 6/2007 | Bapat | H03F 3/217 326/82 |
| 7,528,619 B2 | | 5/2009 | Paillet et al. | |
| 7,937,563 B2 | | 5/2011 | Naffziger et al. | |

(Continued)

OTHER PUBLICATIONS

WIPO Application No. PCT/US2018/019984, International Search Report and Written Opinion of the International Searching Authority, dated May 21, 2018.

*Primary Examiner* — Kenneth B Wells
(74) *Attorney, Agent, or Firm* — Alston & Bird LLP (57) ABSTRACT

Various aspects provide for detecting voltage droops. For example, a system can include a voltage calibrator component and a comparator component. The voltage calibrator component can convert a first supply voltage associated with a power distribution network of an integrated circuit to a second supply voltage via a resistance ladder circuit. The comparator component can generate a comparison output signal in response to a determination that a comparison between the second supply voltage and a reference voltage satisfies a defined criterion.

20 Claims, 10 Drawing Sheets

(56) References Cited

U.S. PATENT DOCUMENTS

| | | | |
|---|---|---|---|
| 8,179,193 B1 * | 5/2012 | Wright | G06F 1/24 |
| | | | 327/143 |
| 8,207,719 B2 * | 6/2012 | Shiota | G05F 1/59 |
| | | | 323/266 |
| 8,269,544 B2 | 9/2012 | Greenhill et al. | |
| 8,847,777 B2 | 9/2014 | Ramaswami | |
| 8,933,737 B1 | 1/2015 | Chatterjee et al. | |
| 2002/0153917 A1 * | 10/2002 | Tanaka | G01R 31/30 |
| | | | 324/762.02 |
| 2009/0072810 A1 * | 3/2009 | Lee | G01R 19/16552 |
| | | | 324/76.11 |
| 2012/0126781 A1 * | 5/2012 | Narayanan | G01R 31/3004 |
| | | | 324/76.11 |

* cited by examiner

VARIATION IMMUNE ON-DIE VOLTAGE DROOP DETECTOR

TECHNICAL FIELD

The subject disclosure relates generally to electrical design, and more particularly to an on-die voltage droop detector.

BACKGROUND

Integrated circuits, such as system-on-chip (SoC) designs or other very-large-scale-integration (VLSI) systems, comprise a number of circuit elements or components that receive supply voltage from, for example, one or more on-die power grids or power distribution networks (PDNs). Although the PDN is designed to supply a nominal operating voltage to the integrated circuit components, a number of operating factors can cause the voltage supplied by the PDN to temporarily drop below this nominal operating voltage, a condition referred to as voltage droop. Supply voltage droop may result when the integrated circuit experiences a sudden increase in switching activity, resulting in transient surges in current draw that may produce a droop in the supply voltage.

The above-described description is merely intended to provide a contextual overview of current techniques and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, a system for detecting voltage droops comprises a voltage calibrator component and a comparator component. The voltage calibrator component is configured for converting a first supply voltage associated with a power distribution network of an integrated circuit to a second supply voltage via a resistance ladder circuit. The comparator component is configured for generating a comparison output signal in response to a determination that a comparison between the second supply voltage and a reference voltage satisfies a defined criterion.

In another example embodiment, a method of detecting droops in supply voltage comprises converting, via a resistance ladder circuit, a first supply voltage associated with a power distribution network of an integrated circuit to a second supply voltage. The method further comprises generating, via a comparator device, a comparison output signal in response to a determination that a comparison between the second supply voltage and a reference voltage satisfies a defined criterion.

In yet another example embodiment, an integrated circuit comprises a power distribution network, a voltage calibrator component, a comparator component and a sampling component. The power distribution network provides a first supply voltage. The voltage calibrator component is configured for converting the first supply voltage to a second supply voltage via a resistance ladder circuit. The comparator component is configured for generating a comparison output signal in response to a determination that a comparison between the second supply voltage and a reference voltage satisfies a defined criterion. The sampling component is configured to synchronously sample the comparison output signal and to output a droop detection signal in response to detecting the comparison output signal.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Integrated circuits, such as system-on-chip (SoC) designs or other very-large-scale-integration (VLSI) systems, are sometimes susceptible to droops in the supply voltage provided to the circuit components via the circuit's supply power domain. These supply voltage droops may be caused by a sudden increase in current consumption by the circuit's active components (e.g., during a brief period when there is a high level of simultaneous switching activity by the circuit's switching components). These supply voltage droops can adversely affect the performance of an SoC or other VLSI.

Designers of SoCs or other integrated circuits may wish to monitor or detect voltage droops during system testing and debug for the purpose of characterizing the system's power supply drooping. This information can be used to design the system for improved voltage droop control. It may also be beneficial to monitor voltage droops during normal circuit operation in order to dynamically compensate for detected power supply droops using Dynamic Voltage and Frequency Scaling (DVFS), thereby improving power performance.

Voltage droop may be detected using a number of different techniques. In one example technique, a delay-chain based time to digital converter (TDC) can be employed. A TDC can, for example, quantize delay on an independent reference voltage against a delay chain on a voltage supply being monitored. When delay between the two chains exceeds a defined target value, difference can be assumed to be based on supply voltage droop associated with the monitored supply. However, employing a TDC generally results in decreased precision with respect to design and dynamic droop compensation, as well as sensitivity issues with respect to process variation and/or temperature variation. In another example technique, a differential amplifier based sensor can be employed. With a differential amplifier based sensor, monitored voltage can be compared to a reference voltage with a built-in voltage offset. The built-in voltage offset can be controlled by a voltage controlled calibration device. However, employing a voltage controlled calibration device generally results in decreased performance. For example, a voltage controlled calibration device is generally sensitive to process variation. As such, voltage controlled calibration devices are generally required to provide at least two calibration voltages for controlling a targeted offset. As a result, complexity to a voltage droop system is increased. In yet another example technique, a voltage divider can be employed to generate a series of reference voltages. In addition to the voltage divider, multiple sensors can be employed to monitor voltage droop. Therefore, complexity to a voltage droop system is also increased when employing a voltage divider and multiple sensors to monitor voltage droop.

To address these and/or other issues, one or more embodiments described herein provide a variation immune on-die droop detector, which offers a number of benefits relative to the techniques described above. For example, the variation immune on-die droop detector can provide improvements with respect to determination and/or detection of voltage droop. In an aspect, the variation immune on-die droop detector can include a voltage divider to calibrate a supply voltage being monitored. As such, a calibration circuit of the variation immune on-die droop detector can be immune from process variation and/or temperature variation. Furthermore, the variation immune on-die droop detector can provide a fixed reference voltage and multiple observation voltages with programmable offsets from the fixed reference voltage. In an embodiment, the variation immune on-die droop detector can be employed with other circuitry to provide Dynamic Voltage and Frequency Scaling (DVFS). Additionally or alternatively, the variation immune on-die droop detector can be employed as a test/debug vehicle to improve understanding of power supply drooping for an integrated circuit (e.g., a system-on-chip system). As such, voltage droop control of an integrated circuit can be improved and/or power-performance of an integrated circuit can be improved. In another aspect, the variation immune on-die droop detector can be located on-die to allow detection results to be sent to other on-die components with low latency and/or to limit an amount of noise produced by the detection system. Moreover, the resource overhead (e.g., in terms of the die, bumps, package, and board) associated with an external voltage reference is not required.

Figure 1:
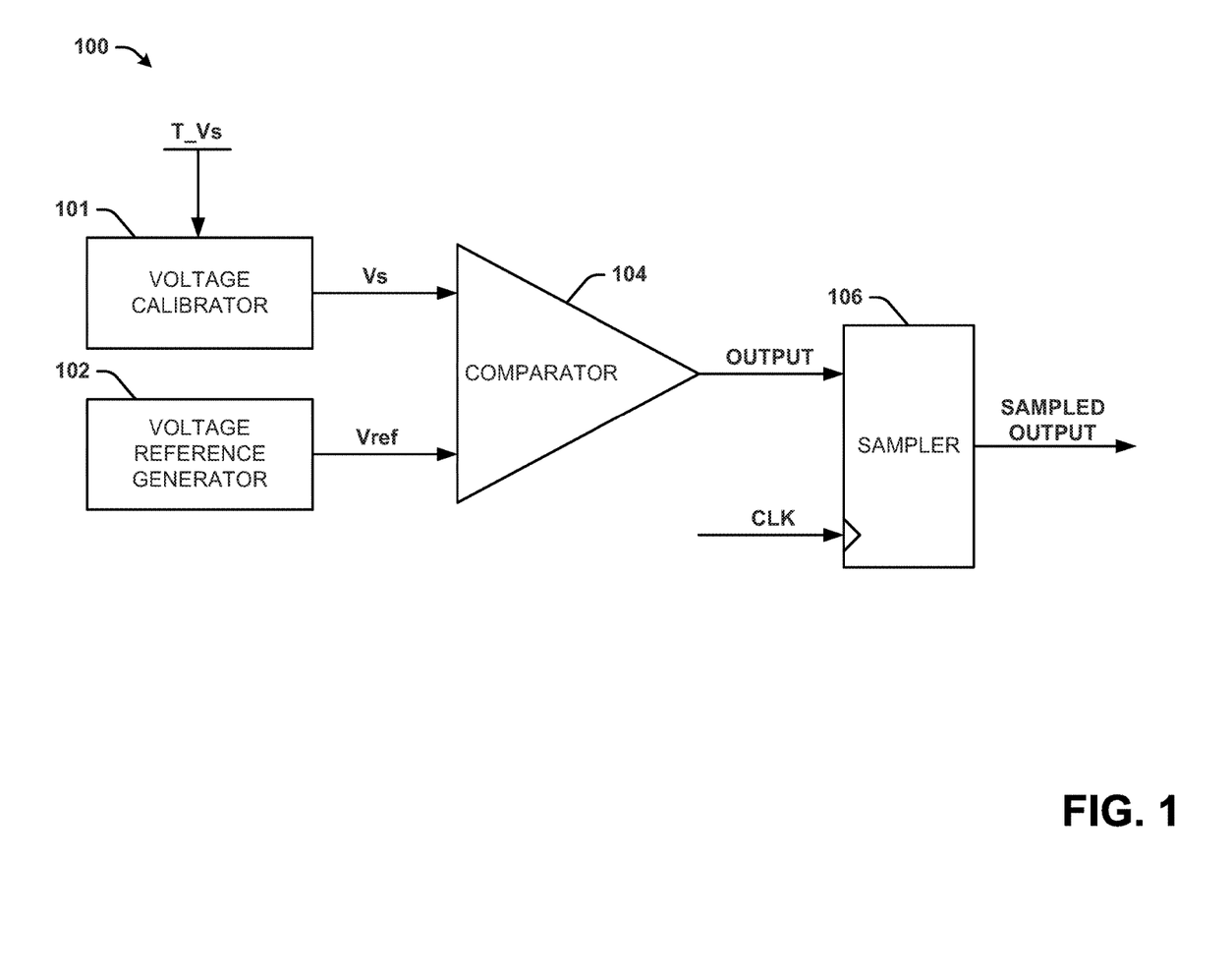
FIG. 1 is a block diagram illustrating an example, non-limiting embodiment of a system in accordance with various aspects described herein.

Turning now to FIG. 1, a block diagram illustrating an example, non-limiting embodiment of a system 100 in accordance with various aspects described herein is shown. The system 100 can be a voltage droop detector such as, for example, an on-die voltage droop detector. In one example, the system 100 can be a variation immune on-die voltage droop detector (e.g., a variation immune high precision droop detector). In an embodiment, the system 100 can be associated with a system-on-chip (SoC). For instance, the system 100 can be an integrated component of an SoC or another integrated circuit. The system 100 can be employed to determine and/or detect voltage droop. In an aspect, the system 100 can be employed to detect droops of a supply voltage of a SoC due to, for example, high switching activity, sudden increases in current consumption, transient current surges, or other such causes.

The system 100 can include a voltage calibrator 101, a voltage reference generator 102, a comparator 104, and a sampler 106. In an embodiment, the voltage calibrator 101, the voltage reference generator 102, the comparator 104, and/or the sampler 106 can be on-die components of an integrated circuit. The voltage calibrator 101 can be an analog voltage calibrator. The voltage calibrator 101 can generate a supply voltage Vs (e.g., Vs shown in FIG. 1) based on a transient supply voltage T_Vs (e.g., T_Vs shown in FIG. 1). For instance, the supply voltage Vs can correspond to a calibrated value of the transient supply voltage T_Vs. In one example, the transient supply voltage T_Vs can be an on-die supply voltage of a SoC. In another example, the transient supply voltage T_Vs can be generated by a power distribution network associated with an integrated circuit. In an embodiment, the voltage calibrator 101 can include resistance ladder circuitry that receives the transient supply voltage T_Vs as input. Based on the transient supply voltage T_Vs, the resistance ladder circuitry of the voltage calibrator 101 can generate a bus of selectable voltages based on an enabled voltage divider circuit of the resistance ladder circuitry. The bus of selectable voltages can be sent to pass-gate based calibration circuitry of the voltage calibrator 101. The pass-gate based calibration circuitry of the voltage calibrator 101 can be controlled by a selected data bus.

The voltage reference generator 102 can generate a reference voltage Vref (e.g., Vref shown in FIG. 1). The reference voltage Vref can be employed as a gauge for a transient voltage of a SoC or another integrated circuit of which the system 100 is an on-die component. In an aspect, the supply voltage Vs can be generated to represent a power grid of the SoC with a certain margin from the reference voltage Vref. In an embodiment, a lowest voltage from the bus of selectable voltages created by voltage calibrator 101 can be transmitted to a low-pass filter of the voltage reference generator 102. The low-pass filter of the voltage reference generator 102 can filter high frequency noises of the lowest voltage from the bus of selectable voltages in order to produce the reference voltage Vref. In certain embodiments, a filtered output voltage of the low-pass filter of the voltage reference generator 102 can be buffered using, for example, a unity-gain amplifier of the voltage reference generator 102. A buffered version of the filtered output voltage of the low-pass can correspond to the reference voltage Vref.

The supply voltage Vs and the reference voltage Vref can be supplied to the comparator 104. The comparator 104 can generate an output (e.g., OUTPUT shown in FIG. 1) in response to a determination that a comparison between the supply voltage Vs and the reference voltage Vref satisfies a defined criterion. The output generated by the comparator 104 can be, for example, a comparison output signal. In an embodiment, the comparator 104 can assert an output (e.g., OUTPUT shown in FIG. 1) in response to detecting that the supply voltage Vs has fallen below the reference voltage Vref in excess of a margin of tolerance, indicating a voltage droop. For example, the output provided by the comparator 104 can be varied (e.g., toggled) upon the supply voltage Vs falling below the reference voltage Vref. In one example, the comparator 104 can be a differential amplifier sensor to facilitate circuitry controlling detection based on voltage rather than delay. The output of comparator 104 can be synchronously sampled by a sampler 106. The sampler 106 can be driven by clock signal CLK (e.g., CLK shown in FIG. 1). In one example, the sampler 106 can be a sample and hold circuit that samples the supply voltage Vs and holds a value of the supply voltage Vs at a constant level for an interval of time associated with the clock signal CLK.

The sampler 106 can generate a sampled output (e.g., SAMPLED OUTPUT shown in FIG. 1). The sampled output can be, for example, a droop detection signal. In an embodiment, the sampled output generated by the sampler 106 can be provided to one or more other integrated components of the SoC associated with the system 100. In another embodiment, the sampled output generated by the sampler 106 can be provided to an external system. In one example, the system 100 can be employed with a logic control block or other components to control a clock frequency of the SoC in accordance with a Dynamic Voltage and Frequency Scaling application. For instance, in response to a determination by the sampler 106 that the output of comparator 104 has been asserted (e.g., indicating that the supply voltage Vs has dropped below the reference voltage Vref), the system 100 can provide the sampled output to a logic control block requesting that a clock frequency of a SoC associated with the system 100 be slowed down (or requesting that clock skipping mode be initiated) in order to reduce chip level activity, thereby reducing current draw by integrated circuit components to a defined level (e.g., a defined operating level), compensating for transient voltage drop, etc. In response to a determination by the sampler 106 that the supply voltage Vs has returned to a defined operating level (e.g., based on the output of comparator 104), the system 100 can send the sampled output to a logic control block requesting that a system clock be gradually returned to a defined clock level (e.g., a normal clock level). As such, dynamic control of a system clock of a SoC can be performed in response to detected voltage droop. Furthermore, a power and performance margin associated with a SoC can be reduced while still maintaining safe SoC operation. It is to be appreciated that this application of the system 100 is only intended to be exemplary, and it is to be appreciated that the system 100 can be employed within the context of other applications without departing from the scope of one or more embodiments described herein.

In an embodiment, the voltage calibrator 101 can be a voltage calibrator component such as, for example, a voltage calibrator circuit. In an embodiment, the voltage calibrator 101 can be a hardware voltage calibrator circuit (e.g., an analog voltage calibrator circuit). In another embodiment, the voltage calibrator 101 can include software functionality for calibrating voltage. In yet another embodiment, the voltage calibrator 101 can be a combination of hardware voltage calibrator circuitry and software functionality for calibrating voltage. Additionally or alternatively, the voltage reference generator 102 can be a voltage reference generator component such as, for example, a voltage reference generator circuit. In an embodiment, the voltage reference generator 102 can be a hardware voltage reference generator circuit (e.g., an analog voltage reference generator circuit). In another embodiment, the voltage reference generator 102 can include software functionality for generating a reference voltage. In yet another embodiment, the voltage reference generator 102 can be a combination of hardware voltage reference generator circuitry and software functionality for generating a reference voltage. Additionally or alternatively, the comparator 104 can be a comparator component such as, for example, a comparator device. In an embodiment, the comparator 104 can be a hardware comparator circuit (e.g., an analog comparator circuit). In another embodiment, the comparator 104 can include software functionality for comparing voltages. In yet another embodiment, the comparator 104 can be a combination of hardware comparator circuitry and software functionality for comparing voltages. Additionally or alternatively, the sampler 106 can be a sampler component such as, for example, a sampler circuit. In an embodiment, the sampler 106 can be a hardware sampler circuit (e.g., an analog sampler circuit). In another embodiment, the sampler 106 can include software functionality for sampling a voltage. In yet another embodiment, the sampler 106 can be a combination of hardware sampler circuitry and software functionality for sampling a voltage.

Figure 2:
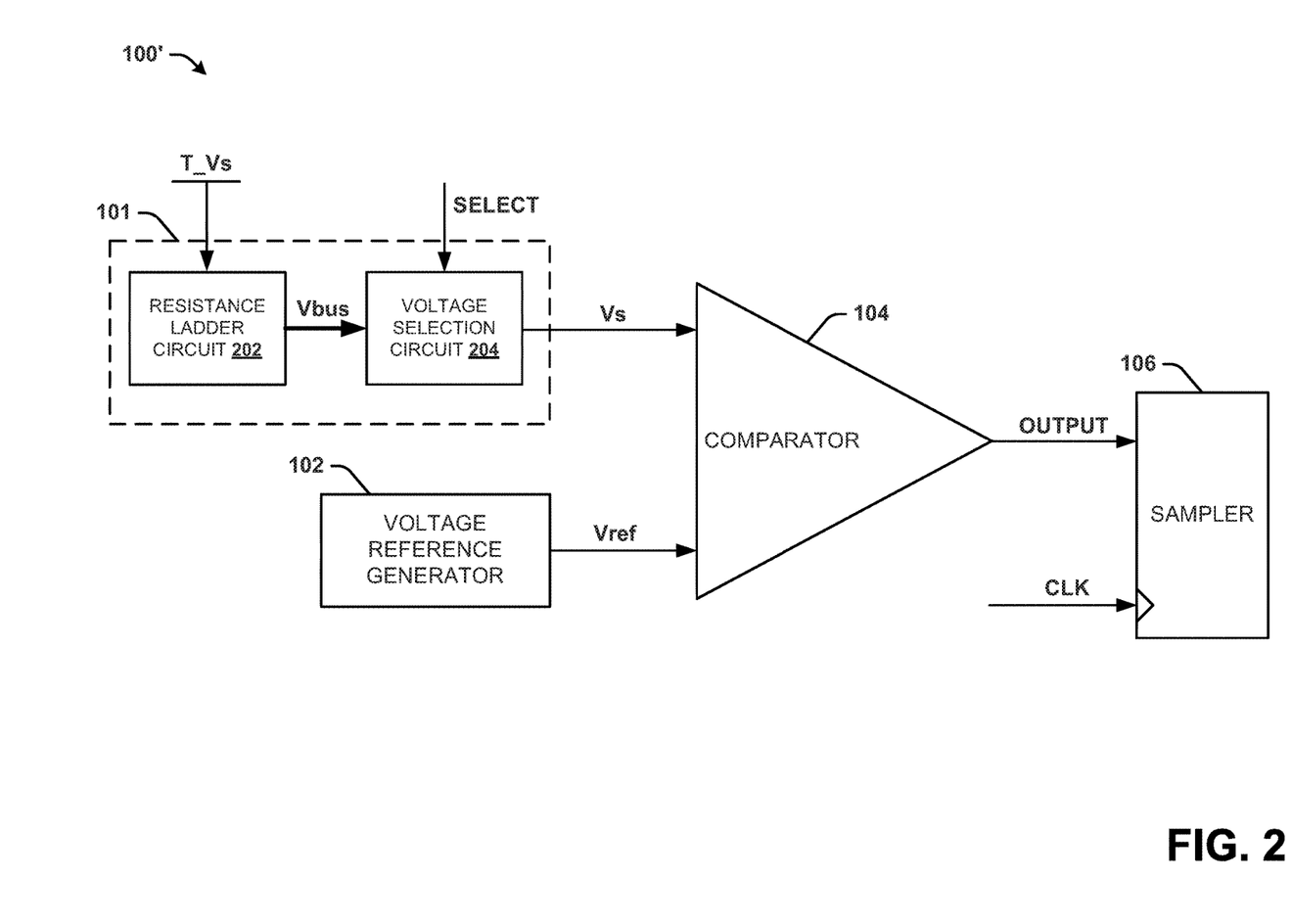
FIG. 2 is a block diagram illustrating another example, non-limiting embodiment of a system in accordance with various aspects described herein.

Referring now to FIG. 2, a block diagram illustrating an example, non-limiting embodiment of a system 100' in accordance with various aspects described herein is shown. The system 100' can be an alternate embodiment of the system 100. The system 100' includes the voltage calibrator 101, the voltage reference generator 102, the comparator 104, and the sampler 106. The voltage calibrator 101 can include a resistance ladder circuit 202 and a voltage selection circuit 204.

The resistance ladder circuit 202 can receive the transient supply voltage T_Vs as input. Based on the transient supply voltage T_Vs, the resistance ladder circuit 202 can generate a bus of voltages Vbus (e.g., a set of voltage values). For example, the bus of voltages Vbus can be a plurality of selectable voltages that can be selected by the voltage selection circuit 204. In an aspect, the resistance ladder circuit 202 can generate the bus of voltages Vbus based on an enabled voltage divider circuit that converts the transient supply voltage T_Vs into a bus of voltages Vbus via a set of series resistors. A voltage level associated with the bus of voltages Vbus can be lower than a voltage level of the transient supply voltage T_Vs. For example, a voltage level of a first bus voltage from the bus of voltages Vbus can be lower than the transient supply voltage T_Vs, a voltage level of a second bus voltage from the bus of voltages Vbus can be lower than the transient supply voltage T_Vs and the first bus voltage, a voltage level of a third bus voltage from the bus of voltages Vbus can be lower than the transient supply voltage T_Vs, the first bus voltage and the second bus voltage, etc. The bus of voltages Vbus can be provided to the voltage selection circuit 204. For example, the bus of voltages Vbus can be provided to a pass-gate based calibration circuit associated with the voltage selection circuit 204. The pass-gate based calibration circuit associated with the voltage selection circuit 204 can be controlled by a selected data bus from the bus of voltages Vbus. The pass-gate based calibration circuit can include, for example, one or more transistors to facilitate further transmission of a selected data bus from the bus of voltages Vbus. The voltage selection circuit 204 can provide the supply voltage Vs based on the transient supply voltage T_Vs and/or a select signal (e.g., SELECT shown in FIG. 1) received by the voltage selection circuit 204. In an aspect, the selected data bus from the bus of voltages Vbus can be selected based on the select signal received by the voltage selection circuit 204. For example, the select signal received by the voltage selection circuit 204 can indicate a data bus from the bus of voltages Vbus to select. The selected data bus from the bus of voltages Vbus can correspond to the supply voltage Vs provided by the voltage selection circuit 204. In an embodiment, the reference voltage Vref can be treated as a DC level at a resonance frequency. Furthermore, the supply voltage Vs can represent a power grid and followed up and down with power grid by a scaled ratio. When the power grid is drooping due to transient current, the supply voltage Vs may dip lower than the reference voltage Vref, resulting a voltage droop. In certain embodiments, a droop margin associated with the comparator 104 can be adjusted by a set of different selectable different supply voltage levels.

Figure 3:
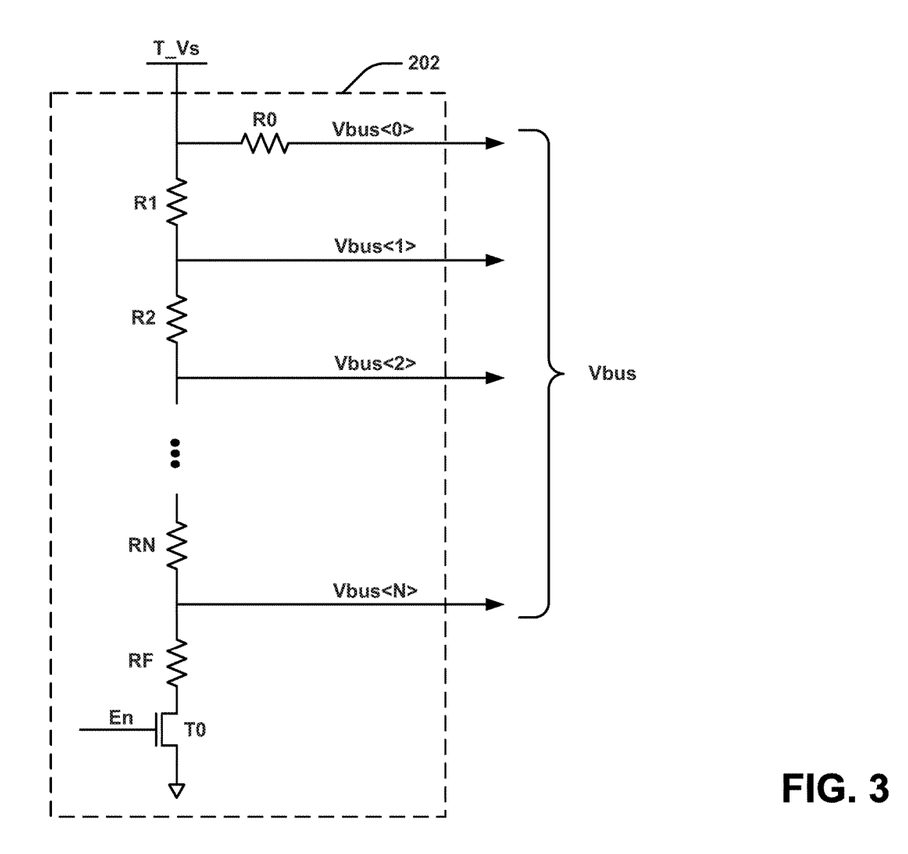
FIG. 3 is a block diagram illustrating an example, non-limiting embodiment of a resistance ladder circuit in accordance with various aspects described herein.

Referring now to FIG. 3, a block diagram illustrating an example, non-limiting embodiment of the resistance ladder circuit 202 in accordance with various aspects described herein is shown. In the embodiment shown in FIG. 3, the resistance ladder circuit 202 can include a set of resistors R0-RN that corresponds to a voltage divider circuit. The resistance ladder circuit 202 can additionally include a resistor RF. Furthermore, the resistance ladder circuit 202 can include a transistor T0. The set of resistors R0-RN can divide the transient supply voltage T_Vs into the bus of voltages Vbus. For instance, the set of resistors R0-RN can be employed to reduce a voltage of the transient supply voltage T_Vs and/or to generate a set of voltage values that are less than the transient supply voltage T_Vs. In an embodiment, the set of resistors R0-RN can consist of N resistors, where N is a number of desired bits for bus of voltages Vbus. In one example, the transient supply voltage T_Vs can be modified by the resistor R0 to provide a voltage Vbus<0>, the transient supply voltage T_Vs can be modified by the resistor R1 and the resistor R2 to provide a voltage Vbus<1>, a modified version of the transient supply voltage T_Vs can be modified by the resistor R2 and the resistor RN to provide a voltage Vbus<2>, and a modified version of the transient supply voltage T_Vs can be modified by the resistor RN and the resistor RF to provide a voltage Vbus<N>. The voltages Vbus<0> through Vbus<N> can correspond to the bus of voltages Vbus. In an aspect, activation of the set of resistors R0-RN and the resistor RF can be controlled by the transistor T0. In one example, the transistor T0 can be an nFET transistor (e.g., the transistor T0 can be an nFET footer switch). A gate of the transistor T0 can receive an enable signal (e.g., ENABLE shown in FIG. 3) to control activation of the transistor T0. A drain of the transistor T0 can be electrically coupled to the resistor RF. Furthermore, a source of the transistor T0 can be electrically coupled to electrical ground. In an embodiment, the resistance ladder circuit 202 can be employed to generate the reference voltage Vref. For instance, a lowest level of the resistance ladder circuit 202 (e.g., the voltage Vbus<N>) can be employed to generate the reference voltage Vref. In one example, the lowest level of the resistance ladder circuit 202 can be employed to generate the reference voltage Vref by passing the lowest level of the resistance ladder circuit 202 (e.g., the voltage Vbus<N>) through a low-pass filter and/or a unit-gain amplifier. It is to be appreciated that values of the set of resistors R0-RN and the resistor RF can be determined and/or varied to achieve a desired droop margin range and/or a desired resolution for a particular design implementation.

Figure 4:
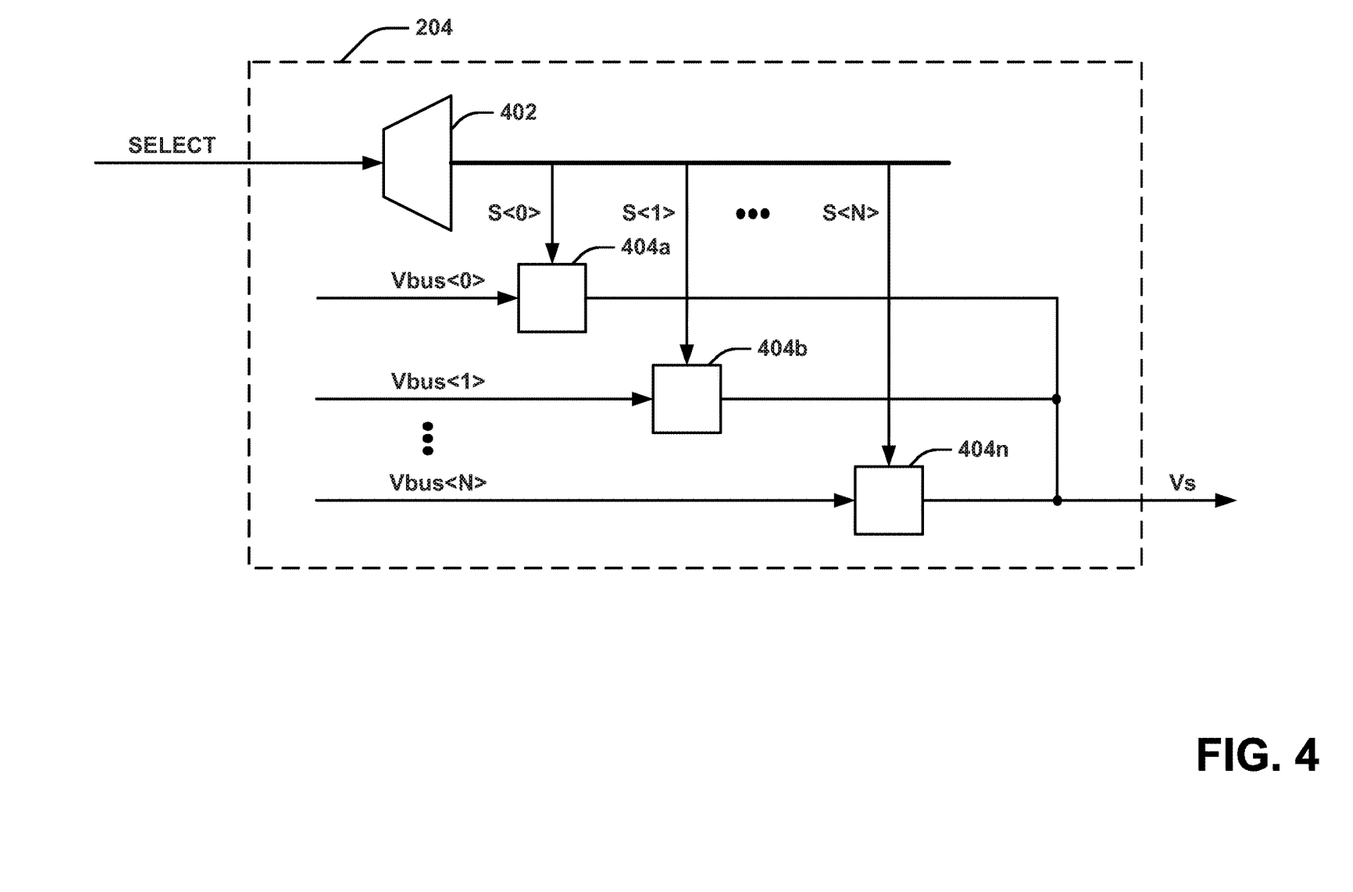
FIG. 4 is a block diagram illustrating an example, non-limiting embodiment of a voltage selection circuit in accordance with various aspects described herein.

Referring now to FIG. 4, a block diagram illustrating an example, non-limiting embodiment of the voltage selection circuit 204 in accordance with various aspects described herein is shown. In the embodiment shown in FIG. 4, the voltage selection circuit 204 can include a decoder 402 and a set of pass-gates 404a-n. The decoder 402 can receive the select signal provided to the voltage selection circuit 204. Furthermore, the decoder 402 can decode the select signal to generate a set of decoded select signals S<0> through S<N>. The voltages Vbus<0> through Vbus<N> can correspond to the bus of voltages Vbus generated by the resistance ladder circuit 202. The set of pass-gates 404a-n can correspond to a pass-gate calibration circuit. In one example, the set of pass-gates 404a-n can correspond to a set of transmission gates (e.g., a set of hardware transmission gates). In another example, the set of pass-gates 404a-n can correspond to a set of logic gates (e.g., a set of hardware logic gates). In yet another example, the set of pass-gates 404a-n can correspond to a set of electronic switches. In an embodiment, the set of pass-gates 404a-n can correspond to a set of transistor components. In an aspect, the set of decoded select signals S<0> through S<N> can be passed to the set of pass-gates 404a-n to select a voltage from the voltages Vbus<0> through Vbus<N> as the supply voltage Vs (e.g., to select a voltage from the voltages Vbus<0> through Vbus<N> as a target voltage droop). In an embodiment, the set of pass-gates 404a-n can correspond to a pFET transistor (e.g., a single pFET transistor). In another embodiment, the set of pass-gates 404a-n can correspond to an nFET transistor (e.g., a single nFET transistor). In yet another embodiment, the set of pass-gates 404a-n can correspond to a pFET/nFET transistor pair.

Figure 5:
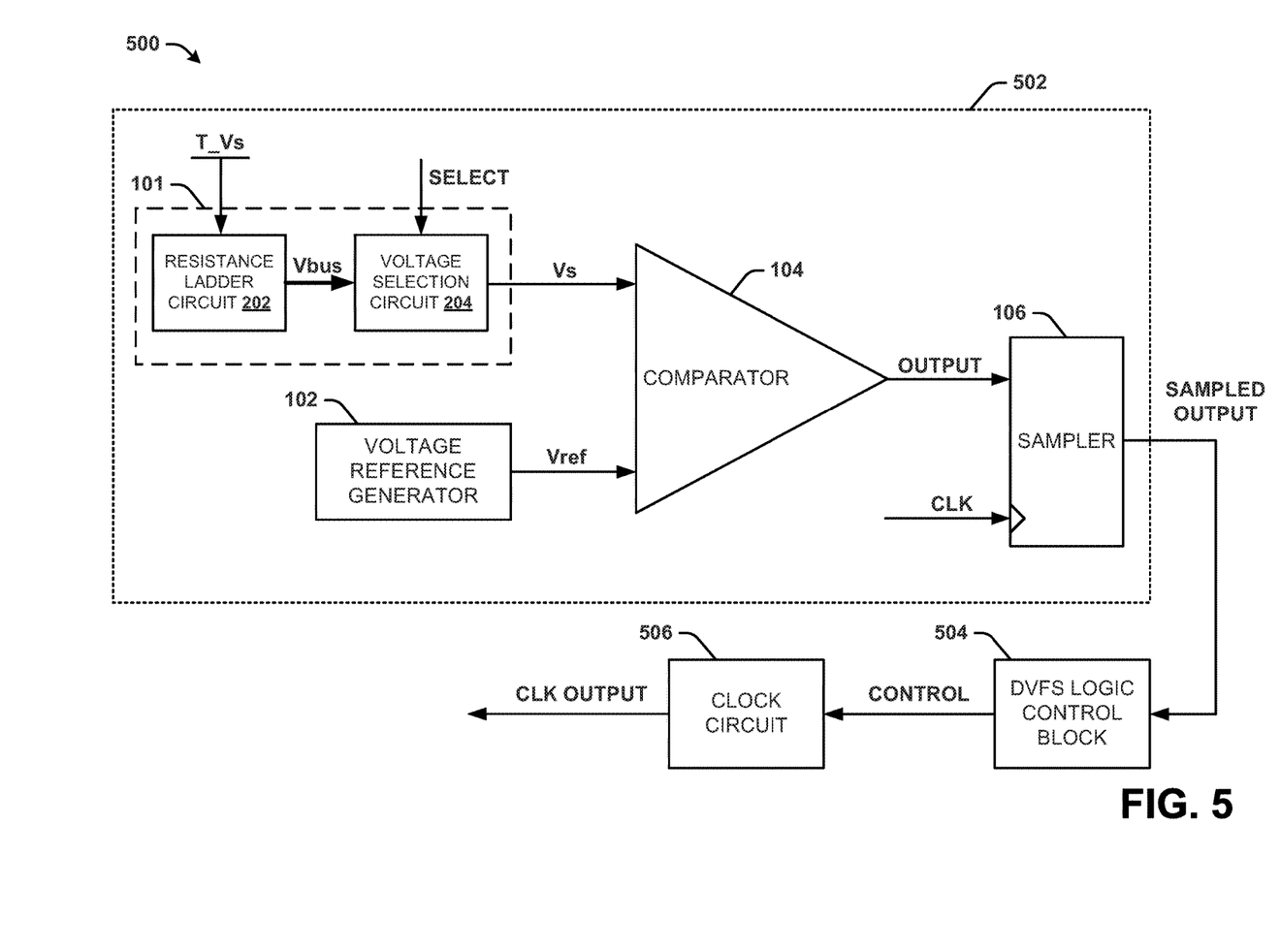
FIG. 5 is a block diagram illustrating yet another example, non-limiting embodiment of a system in accordance with various aspects described herein.

Referring now to FIG. 5, a block diagram illustrating an example, non-limiting embodiment of a system 500 in accordance with various aspects described herein is shown. The system 500 can include a system 502, a DVFS logic control block 504 and a clock circuit 506. The system 502 can correspond to the system 100 or the system 100'. As noted above, the system 100 and/or the system 100' can be implemented as a component of an on-die DVFS system to dynamically compensate for supply voltage droops. FIG. 5 is a diagram illustrating an example on-die DVFS implementation. In this example, operations carried out by components of an integrated circuit (e.g. an SoC or other VLSI system) are driven by a system clock pulse signal CLK produced by the clock circuit 506, which ensures synchronized operation of the circuit components.

The sampled output provided by the sampler 106 can be provided to the DVFS logic control block 504, which is configured to control (e.g., adjust) the frequency of the clock signal output (e.g., CLK OUTPUT shown in FIG. 5) generated by clock circuit 506 in response to detection of a supply voltage droop by the system 502. For example, in response to receiving a sampled signal from the system 502 indicating that a supply voltage droop has occurred, the DVFS logic control block 504 can send a control signal (e.g., CONTROL shown in FIG. 5) to the clock circuit 506. The clock circuit 506 can reduce a frequency of the clock signal output. Additionally or alternatively, the control signal can cause the clock circuit 506 to enter a mode in which clock cycles are skipped. As such chip-level activity can be reduced (e.g., temporarily reduced) in response to the detected voltage droop, thereby reducing overall current consumption by circuit components and/or reducing load on the supply voltage Vs. This reduced current consumption can assist in bringing the supply voltage Vs back to an acceptable level while allowing the system 500 to continue operating within normal performance parameters. When the sampled output from the system 502 indicates that the supply voltage Vs has returned to normal levels (e.g., the voltage droop condition has been eliminated), the DVFS logic control block 504 will instruct the clock circuit 506 to gradually return the clock signal output to a defined frequency (e.g., a normal operating frequency). In an embodiment, the clock signal output provided by the clock circuit 506 can be a system clock signal.

In an embodiment, the system 502 (e.g., the system 100 and/or the system 100') can be suitable for use in such DVFS systems by virtue of the fact that the system 502 (e.g., the system 100 and/or the system 100') can reside on a die, which ensures low latency responses to detected voltage droops. Moreover, in an embodiment where the reference voltage Vref associated with the system 502 (e.g., the system 100 and/or the system 100') is derived from the same supply voltage that powers SoC components (e.g., as opposed to using a voltage reference from a different power domain), the system 502 (e.g., the system 100 and/or the system 100') remains free of noise and/or distortion that would otherwise be introduced by another voltage supply. It is to be appreciated that the system 502 (e.g., the system 100 and/or the system 100') is not limited to use within a DVFS application. For example, in other example scenarios the system 502 (e.g., the system 100 and/or the system 100') may be used strictly for observational purposes (e.g., by outputting indications of detected supply voltage droops to an external monitoring or recording system that displays and/or maintains a record of voltage droop occurrences). Other applications of the system 502 (e.g., the system 100 and/or the system 100') are also within the scope of one or more embodiments described herein.

Figure 6:
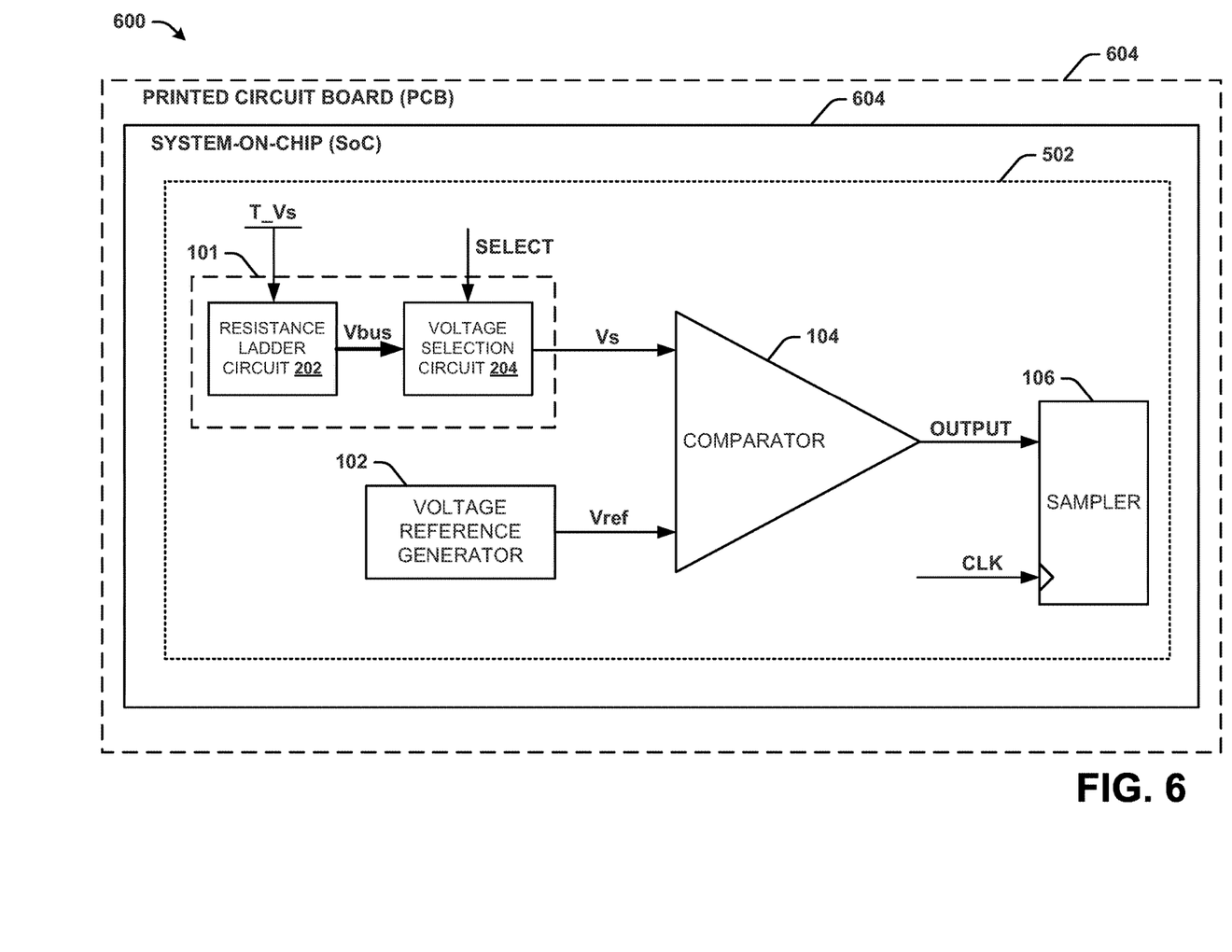
FIG. 6 is a block diagram illustrating an example, non-limiting embodiment of a system associated with a system-on-chip in accordance with various aspects described herein.

Referring now to FIG. 6, a block diagram illustrating an example, non-limiting embodiment of a system 600 in accordance with various aspects described herein is shown. The system can include a printed circuit board (PCB) 602, a system-on-chip (SoC) 604 and the system 502 (e.g., the system 100 and/or the system 100'). The system 502 (e.g., the system 100 and/or the system 100') can be an on-die voltage droop detector integrated on the SoC 604. In an embodiment, the SoC 604 can be integrated on the PCB 602.

Figure 7:
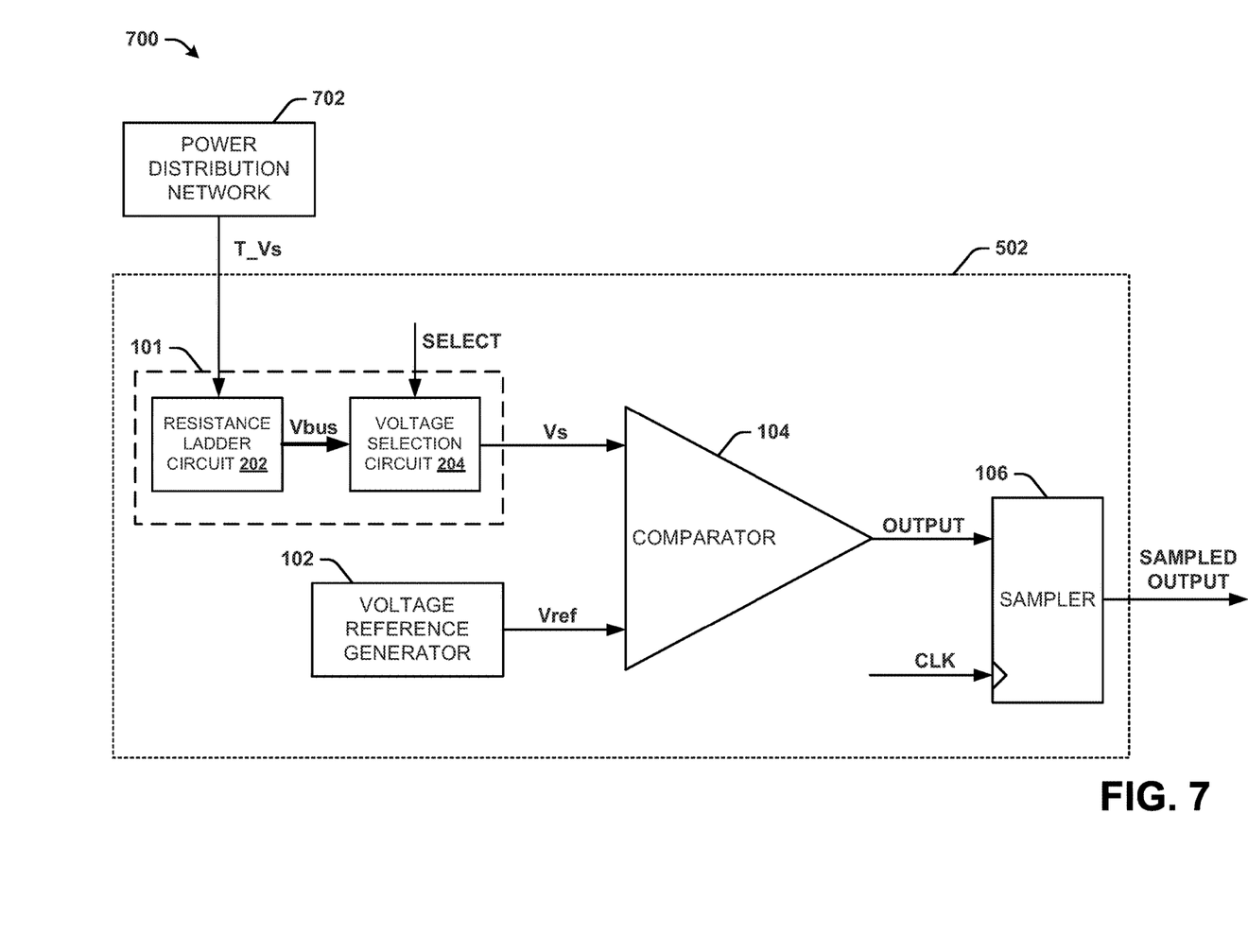
FIG. 7 is a block diagram illustrating an example, non-limiting embodiment of a system associated with a power distribution network in accordance with various aspects described herein.

Referring now to FIG. 7, a block diagram illustrating an example, non-limiting embodiment of a system 700 in accordance with various aspects described herein is shown. The system can include the system 502 (e.g., the system 100 and/or the system 100') and a power distribution network 702. The power distribution network 702 can generate and/or provide the transient supply voltage T_Vs to the system 502 (e.g., the system 100 and/or the system 100'). For instance, the power distribution network 702 can generate and/or provide the transient supply voltage T_Vs to the resistance ladder circuit 202 of the voltage calibrator 101. In an embodiment, the system 502 (e.g., the system 100 and/or the system 100') and/or the power distribution network 702 can be implemented on an integrated circuit.

In certain embodiments, aspects of the systems, apparatuses or processes explained in this disclosure (e.g., aspects of the voltage calibrator 101, the voltage reference generator 102, the comparator 104, the sampler 106, the DVFS logic control block 504 and/or the clock circuit 506) can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. For example, a system can include a memory for storing computer executable components and instructions. Furthermore, the system can include a processor to facilitate operation of the instructions (e.g., computer executable components and instructions) by the system.

Figure 8:
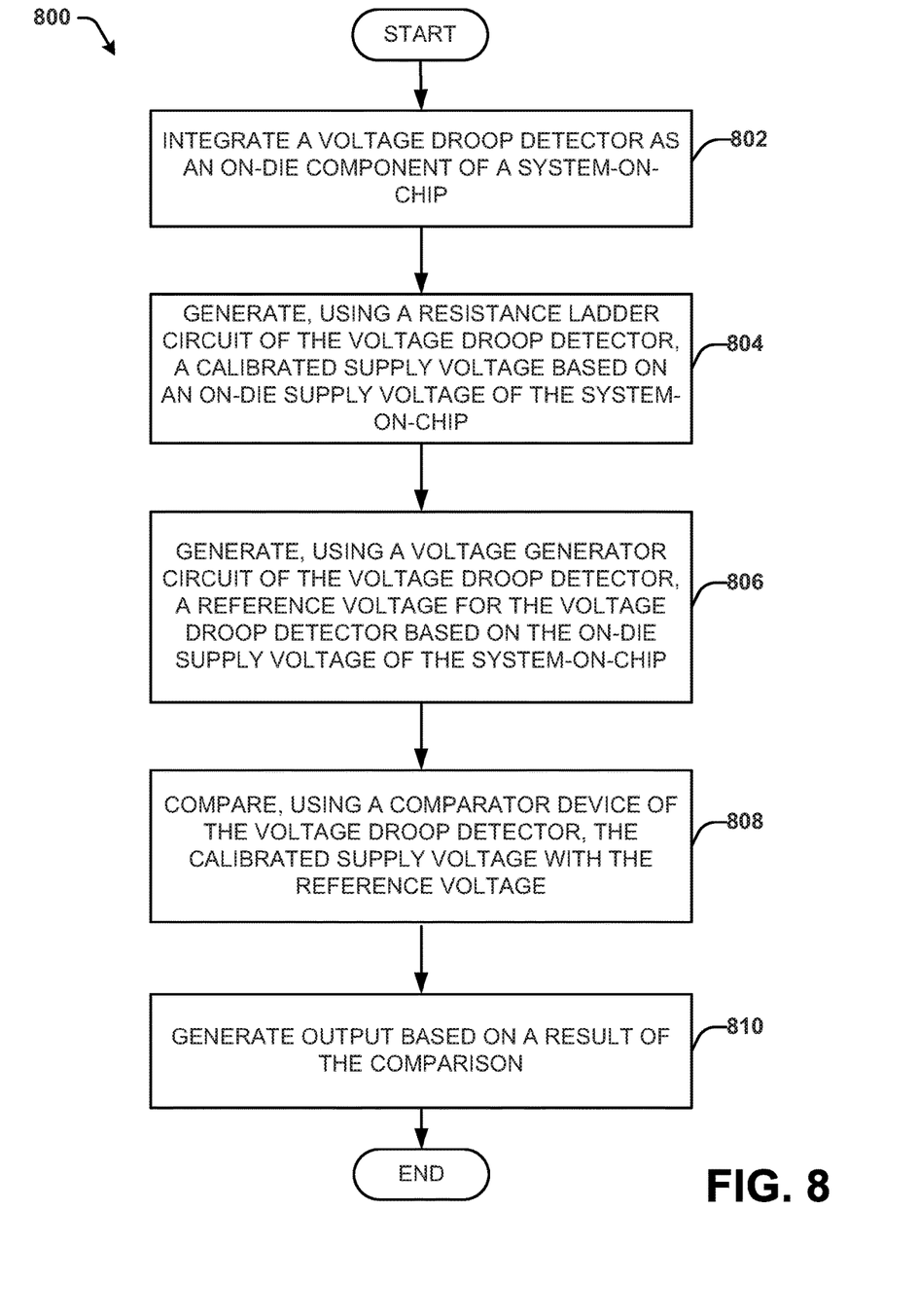
FIG. 8 illustrates a flow diagram of an example, non-limiting embodiment of a method for detecting voltage droop.
Figure 9:
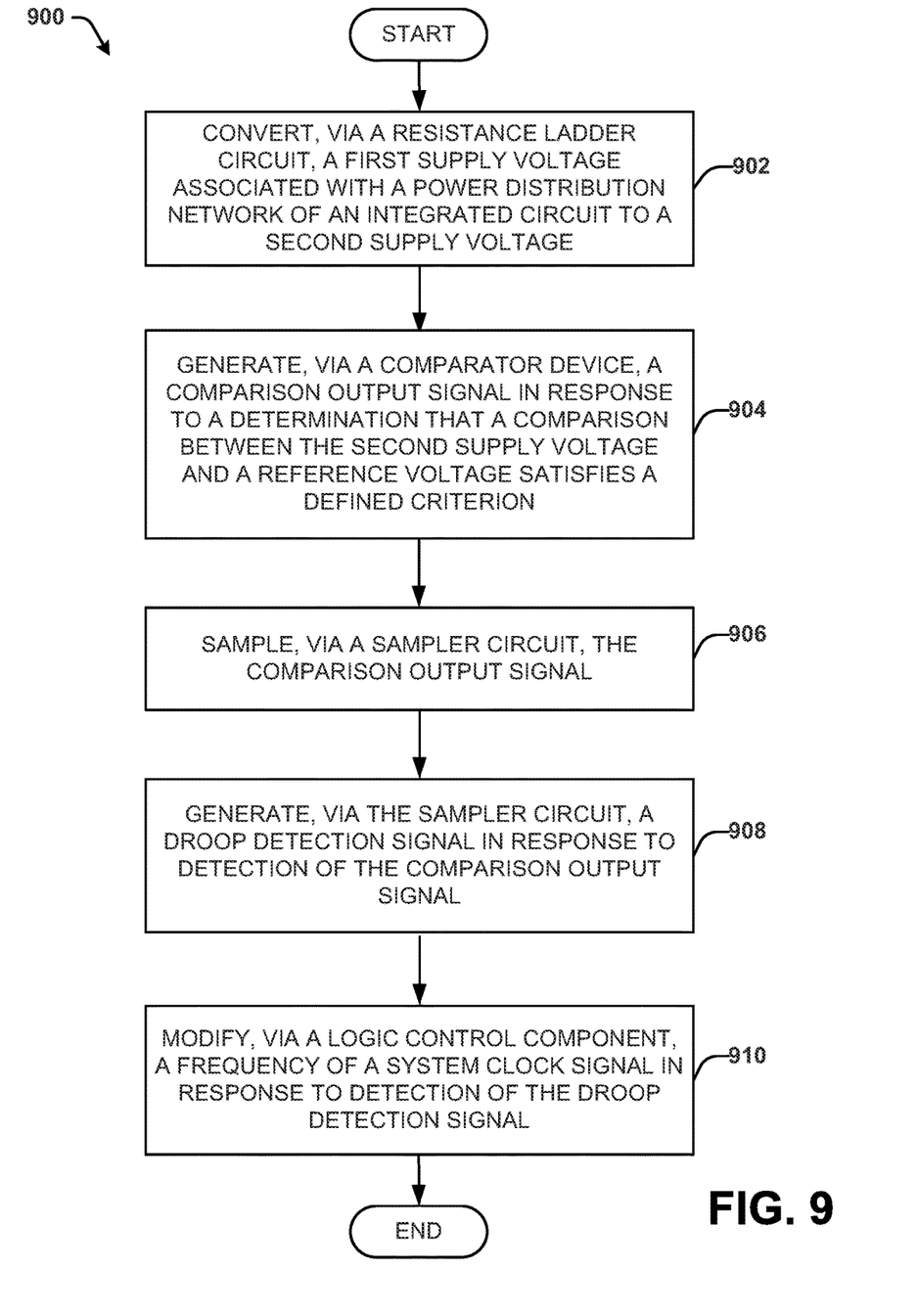
FIG. 9 illustrates a flow diagram of another example, non-limiting embodiment of a method for detecting voltage droop.
Figure 10:
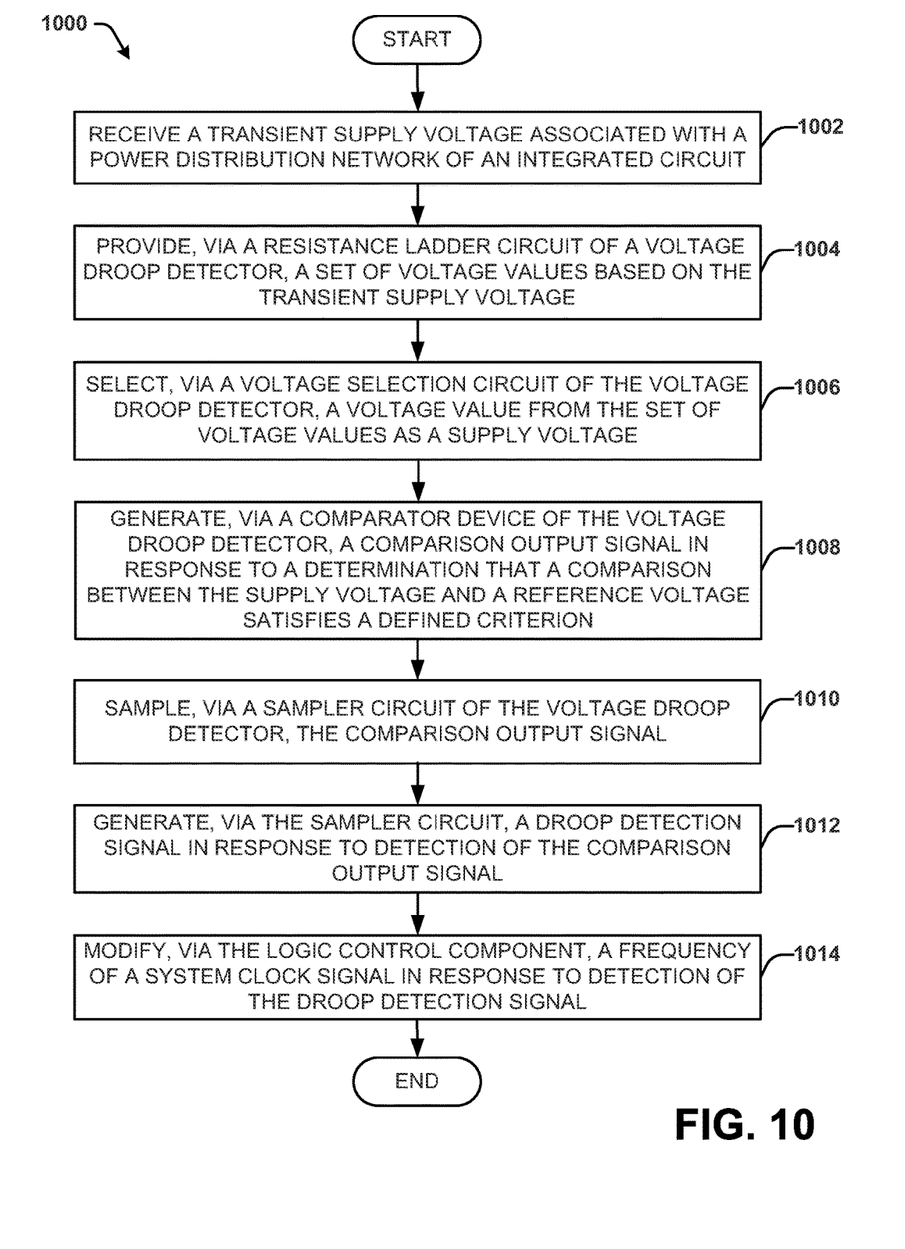
FIG. 10 illustrates a flow diagram of yet another example, non-limiting embodiment of a method for detecting voltage droop.

In view of the example systems described above, methods that may be implemented in accordance with the described subject matter may be better appreciated with reference to the flow charts of FIGS. 8-10. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Referring to FIG. 8, a flow diagram of an example, non-limiting embodiment of a method for detecting voltage droop is shown. Method 800 can begin at block 802, where a voltage droop detector integrated as on on-die component of a system-on-chip. At block 804, a calibrated supply voltage is generated, using a resistance ladder circuit of the voltage droop detector, based on an on-die supply voltage of the system-on-chip. For example, the resistance ladder circuit 202 can generate the supply voltage Vs based on the transient supply voltage T_Vs, where the supply voltage Vs is the calibrated supply voltage and the transient supply voltage T_Vs is the on-die supply voltage of the system-on-chip. In an aspect, the resistance ladder circuit of the voltage droop detector can include a voltage divider circuit that generates the calibrated supply voltage based on the on-die supply voltage. In one example, a voltage value of the calibrated supply voltage can be lower than the on-die supply voltage. At block 806, a reference voltage for the voltage droop detector is generated, using a voltage generator circuit of the voltage droop detector, based on the on-die supply voltage of the system-on-chip. In one example, reference voltage can be obtained by filtering and/or buffering at least a portion of the on-die supply voltage of the system-on-chip to generate the reference voltage. At block 808, the calibrated supply voltage is compared with the reference voltage using a comparator device of the voltage droop detector. At block 810, output is generated based on the result of the comparison. For example, the comparator device can assert the output in response to detecting that the calibrated supply voltage has fallen below the reference voltage in excess of a margin of tolerance, indicating a voltage droop. In one example, the output provided can be varied (e.g., toggled) upon the calibrated supply voltage falling below the reference voltage.

Referring to FIG. 9, a flow diagram of another example, non-limiting embodiment of a method for detecting voltage droop is shown. Method 900 can begin at block 902, where a first supply voltage associated with a power distribution network of an integrated circuit is converted to a second supply voltage via a resistance ladder circuit. For example, the resistance ladder circuit 202 can convert the transient supply voltage T_Vs into the supply voltage Vs, where the supply voltage Vs is the second supply voltage and the transient supply voltage T_Vs is the first supply voltage associated with the power distribution network of the integrated circuit. In an aspect, the resistance ladder circuit can include a voltage divider circuit that converts the first supply voltage into the second supply voltage. In one example, a voltage value of the second supply voltage can be lower than the first supply voltage (e.g., the converting can include reducing the first supply voltage to the second supply voltage).

At block 904, a comparison output signal is generated, via a comparator device, in response to a determination that a comparison between the second supply voltage and a reference voltage satisfies a defined criterion. For example, the comparator device can assert the comparison output signal in response to detecting that the second supply voltage has fallen below the reference voltage in excess of a margin of tolerance, indicating a voltage droop. In one example, the comparison output signal can be varied (e.g., toggled) upon the second supply voltage falling below the reference voltage.

At block 906, the comparison output signal is sampled via a sampler circuit. For example, the comparison output signal can be synchronously sampled based on a clock signal. In one example, the comparison output signal can be sampled and a value of the comparison output signal can be held at a constant level for an interval of time associated with the clock signal.

At block 908, a droop detection signal is generated, via the sampler circuit, in response to detection of the comparison output signal. For example, when the sampler circuit detects that the comparison output signal has been asserted, indicating that the second supply voltage has dropped below the reference voltage, the sampler circuit can provide the droop detection signal.

At 910, a frequency of a system clock signal is modified, via a logic control component, in response to detection of the droop detection signal. For example, the logic control component (e.g., a DVFS logic control block) can control the frequency of a system clock signal generated by a clock circuit based on the droop detection signal. In one example, in response to receiving the droop detection signal indicating that a supply voltage droop has occurred, the logic control component can send a control signal to a clock circuit that can reduce a frequency of the system clock signal.

In an embodiment, the method 900 can further include providing, via the resistance ladder circuit, a set of voltage values based on the first supply voltage. In another embodiment, the method can further include selecting, via a voltage selection circuit, a voltage value from the set of voltage values, the voltage value corresponding to the second supply voltage. Additionally or alternatively, the method 900 can include providing, via a voltage selection circuit, the voltage value to the comparator device. Additionally or alternatively, the generating the comparison output signal can include generating the comparison output signal in response to a determination that the second supply voltage has deviated from the reference voltage in excess of a margin. In certain embodiments, the method 900 can include sampling, via a sampler circuit, the comparison output signal. Additionally or alternatively, the method 900 can include generating, via the sampler circuit, a droop detection signal in response to detection of the comparison output signal. Additionally or alternatively, the method 900 can include modifying, via the logic control component, a frequency of a system clock signal in response to detection of the droop detection signal.

Referring to FIG. 10, a flow diagram of yet another example, non-limiting embodiment of a method for detecting voltage droop is shown. Method 1000 can begin at block 1002, where a transient supply voltage associated with a power distribution network of an integrated circuit is received. At block 1004, a set of voltage values is provided, via a resistance ladder circuit of a voltage droop detector, based on the transient supply voltage. For example, a bus of voltages can be generated based on a voltage divider circuit of the resistance ladder circuit that converts the transient supply voltage into the bus of voltages. At block 1006, a voltage value from the set of voltage values as a supply voltage is selected via a voltage selection circuit of the voltage droop detector. At block 1008, a comparison output signal is generated, via a comparator device of the voltage droop detector, in response to a determination that a comparison between the supply voltage and a reference voltage satisfies a defined criterion. At block 1010, the comparison output signal is sampled via a sampler circuit of the voltage droop detector. At block 1012, a droop detection signal is generated, via the sampler circuit, in response to detection of the comparison output signal. At block 1014, a frequency of a system clock signal is modified, via the logic control component, in response to detection of the droop detection signal.

Reference throughout this specification to "one embodiment," "an embodiment," "an example," "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "engine," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A system for detecting voltage droops, comprising:
a voltage calibrator component configured for converting a first supply voltage associated with a power distribution network of an integrated circuit to a second supply voltage via a resistance ladder circuit, the resistance ladder circuit configured for generating a bus of voltages comprising a plurality of selectable voltages, the voltage calibrator component comprising a decoder and a pass-gate calibration circuit configured for receiving a select signal and enabling a pass-gate of the calibration circuit corresponding to the select signal in order to select a selectable voltage value based on a detected voltage droop; and
a comparator component configured for generating a comparison output signal in response to a determination that a comparison between the second supply voltage and a reference voltage satisfies a defined criterion.

2. The system of claim 1, wherein the resistance ladder circuit comprises a voltage divider circuit configured for reducing the first supply voltage to the second supply voltage.

3. The system of claim 1, wherein the second supply voltage corresponds to the selectable voltage value.

4. The system of claim 1, wherein the comparator component is configured for generating the comparison output signal in response to a determination that the second supply voltage has deviated from the reference voltage in excess of a margin.

5. The system of claim 1, further comprising a voltage reference generator component configured for generating the reference voltage based on one selectable voltage of a plurality of selectable voltages generated by the resistance ladder circuit.

6. The system of claim 1, further comprising a sampling component configured for synchronously sampling the comparison output signal and for generating a droop detection signal in response to detection of the comparison output signal.

7. The system of claim 6, further comprising a logic control component configured to modify a frequency of a system clock signal in response to detection of the droop detection signal.

8. The system of claim 1, wherein the voltage calibrator component and the comparator component are on-die components of the integrated circuit.

9. The system of claim 1, wherein the pass-gate calibration circuit comprises one or more of a set of hardware transmission gates, a set of hardware logic gates, a set of electronic switches, and a set of transistor components.

10. The system of claim 1, wherein the selectable voltage value is selected as a target voltage droop.

11. A method of detecting droops in supply voltage, comprising:
converting, via a resistance ladder circuit, a first supply voltage associated with a power distribution network of an integrated circuit to a second supply voltage, wherein the converting comprises:
generating, via the resistance ladder circuit, a bus of voltages comprising a plurality of selectable voltages; and
receiving, via a decoder and a pass-gate calibration circuit, a select signal and enabling a pass-gate of the calibration circuit corresponding to the select signal in order to select a selectable supply voltage value based on a detected voltage droop; and
generating, via a comparator device, a comparison output signal in response to a determination that a comparison between the second supply voltage and a reference voltage satisfies a defined criterion.

12. The method of claim 11, wherein the converting comprises reducing the first supply voltage to the second supply voltage.

13. The method of claim 11, further comprising:
providing, via a voltage selection circuit, the selectable voltage value to the comparator device as the second supply voltage.

14. The method of claim 11, wherein the generating the comparison output signal comprises generating the comparison output signal in response to a determination that the second supply voltage has deviated from the reference voltage in excess of a margin.

15. The method of claim 11, further comprising:
sampling, via a sampler circuit, the comparison output signal; and
generating, via the sampler circuit, a droop detection signal in response to detection of the comparison output signal.

16. The method of claim 15, further comprising:
modifying, via a logic control circuit, a frequency of a system clock signal in response to detection of the droop detection signal.

17. An integrated circuit, comprising:
a power distribution network that provides a first supply voltage;
a voltage calibrator component configured for converting the first supply voltage to a second supply voltage via a resistance ladder circuit, the resistance ladder circuit configured for generating a bus of voltages comprising a plurality of selectable voltages, the voltage calibrator component comprising a decoder and a pass-gate calibration circuit configured for receiving a select signal and enabling a pass-gate of the calibration circuit corresponding to the select signal in order to select a selectable voltage value based on a detected voltage droop;
a comparator component configured for generating a comparison output signal in response to a determination that a comparison between the second supply voltage and a reference voltage satisfies a defined criterion; and
a sampling component configured to synchronously sample the comparison output signal and to output a droop detection signal in response to detecting the comparison output signal.

18. The integrated circuit of claim 17, wherein the second supply voltage corresponds to the selectable voltage value.

19. The integrated circuit of claim 17, further comprising a voltage reference generator component configured for generating the reference voltage based on one selectable voltage of a plurality of selectable voltages generated by the resistance ladder circuit.

20. The integrated circuit of claim 17, further comprising a logic control component configured to adjust a frequency of a system clock signal in response to detecting of the droop detection signal.

* * * * *